(12) United States Patent
Schatz et al.

(10) Patent No.: US 6,183,605 B1
(45) Date of Patent: *Feb. 6, 2001

(54) AC POWERED SYSTEM FOR CONTINUOUS DEPOSITION OF A CATHODE MATERIAL

(75) Inventors: Douglas S. Schatz; Richard A. Scholl, both of Fort Collins, CO (US)

(73) Assignee: Advanced Energy Industries, Inc., Fort Collins, CO (US)

(*) Notice: Under 35 U.S.C. 154(b), the term of this patent shall be extended for 0 days.

This patent is subject to a terminal disclaimer.

(21) Appl. No.: 09/285,353

(22) Filed: Apr. 2, 1999

Related U.S. Application Data (63) Continuation of application No. 08/864,766, filed on May 28, 1997, now Pat. No. 5,897,753.

(51) Int. Cl.[7] .................................................. C23C 14/34
(52) U.S. Cl. ............................ 204/192.12; 204/298.06; 204/298.08; 204/298.14
(58) Field of Search ..................... 204/298.06, 298.08, 204/298.14, 298.03, 192.12, 192.15, 192.22, 192.23, 192.16, 192.13

(56) References Cited

U.S. PATENT DOCUMENTS

| | | | |
|---|---|---|---|
| 3,436,332 | 4/1969 | Oda et al. | 204/298 |
| 3,464,907 | 9/1969 | Froemel et al. | 204/192 |
| 3,507,774 | 4/1970 | Muly, Jr. et al. | 204/298 |
| 3,676,320 | 7/1972 | Christensen et al. | 204/192 |
| 3,709,809 | 1/1973 | Wright et al. | 204/192 |
| 4,201,654 | 5/1980 | Castleman et al. | 204/298 |
| 4,247,383 | 1/1981 | Greve et al. | 204/298 |
| 4,853,102 | 8/1989 | Tateishi et al. | 204/298 |
| 4,986,890 | 1/1991 | Setoyama et al. | 204/298.06 |
| 4,988,422 | 1/1991 | Wirz | 204/192.15 |
| 5,006,192 | 4/1991 | Deguchi | 156/345 |
| 5,178,739 | 1/1993 | Barnes et al. | 204/192 |
| 5,417,834 | 5/1995 | Latz | 204/298 |
| 5,460,707 | 10/1995 | Wellerdieck | 204/298.08 |
| 5,897,753 | * 4/1999 | Schatz et al. | 204/192.12 |

FOREIGN PATENT DOCUMENTS

| | | | |
|---|---|---|---|
| 4237517A1 | 5/1994 | (DE) | C23C/14/35 |
| 44 38 463 C1 | 2/1995 | (DE) | H05H/1/46 |
| 0591675A1 | 8/1993 | (EP) | H01J/37/34 |
| 0692550A1 | 1/1996 | (EP) | C23C/14/00 |
| 59096266 | 2/1984 | (JP) | C23C/15/00 |

OTHER PUBLICATIONS

"A Quasi–direct–current Sputtering Technique For The Deposition of Dielectrics At Enhanced Rates", by G. Este and W.D. Westwood, J.Vac. Sci, Technol. A 6 (3) May/Jun. 1988, © 1988 American Vacuum Society, pp. 1845–1848.

"Pulsed Magnetron Sputter Technology", by S. Schiller, K. Goedicke, J. Reschke, V. Kirchhoff, S. Schneider and F. Milde, Apr. 19–23. 1993, submitted to international Conference On Metallurgical Coatings And Thin Films, ICM-CTF93, San Diego, California, pp. 1–24.

\* cited by examiner

Primary Examiner—Rodney G. McDonald
(74) Attorney, Agent, or Firm—Santangelo Law Offices, P.C.

(57) ABSTRACT

A method and an apparatus are disclosed for sputter deposition of an insulating material on a substrate in a continuous mode of operation. A novel design for an anode assembly and driving power supply is disclosed to permit this. Single or multiple anodes are used, which at any given time may be biased negatively with respect to the plasma, so that any insulating material which may have been deposited thereupon may be sputtered away so as to provide a clean positive anode to the system, and at least for some period of time is biased positively so that it acts as an anode. The removal of any insulating material which may have formed on the anode structure permits its continuing effective use in collecting electrons from the plasma when it is biased positively, and therefore its continuing effective use as an anode for the system, permitting continuous operation of the system.

33 Claims, 6 Drawing Sheets

AC POWERED SYSTEM FOR CONTINUOUS DEPOSITION OF A CATHODE MATERIAL

This is a continuation of application Ser. No. 08/864,766, filed May 28, 1997, issued as a U.S. Pat. No. 5,897,753, hereby incorporated by reference.

BACKGROUND OF THE INVENTION

The present invention generally relates to reactive plasma sputter deposition techniques for forming and depositing insulating films on substrates and, more particularly, is concerned with a system and method for sputter deposition of an insulating material on a substrate.

Sputtering is a process wherein a target, usually a metal, is placed in position near a plasma (a cloud of ions and electrons in equal numbers), in a chamber in which most of the air has been withdrawn. Well-known conventional means are used to create the plasma. A negative voltage is produced on the target, or cathode, relative to a separate electrode called the anode by connecting the negative lead of a dc power supply to the target. The negative voltage on the target attracts the ions from the plasma, which are accelerated toward the target. Upon arrival the collision of the ions with the target physically knocks out target atoms. These target atoms travel from the target to a substrate placed nearby, which becomes coated with them. The expelled target atoms also coat every other surface in the system, as for the most part, they are neutral and there is no practical way to direct their path. When ions are withdrawn from the plasma, there immediately exists an excess of electrons in the plasma. These excess electrons are attracted to the positive lead of the dc power supply used to create the target voltage, which positive lead is connected to a separate electrode called the anode or alternatively to the chamber walls, either of which, in collecting the electrons, provide for plasma current flow and therefore may be considered as plasma current providing elements.

As described, this is a very common process for deposition of thin layers of metals. It is widely used in the processing of semiconductors, and in creating the reflecting layer on compact discs and CD-ROMS, active layers on hard discs for computer storage, and layers of metals for many other functional and decorative applications.

The process described above is called dc sputtering, and requires that the target (or cathode) be conducting, because the ions arriving at the target must be able to accept one or more electrons from the target to become neutral gas atoms again in order to prevent charging of the target surface, which would create a retarding potential which would stop the process very quickly. Insulators do not have free electrons available for this purpose, so that an insulating target material cannot be used. On the other hand, one can deposit layers of insulating material from a metallic target, by forming the insulator chemically through reaction with a reactive background gas. This is called reactive sputtering. For example, $Al_2O_3$ and $SiO_2$, can be created from aluminum and silicon targets, respectively, if oxygen gas is present in appropriate quantities in the background gas filling the chamber.

There is increasing commercial interest in processes involving deposition of such insulating films. This interest comes about at least in part because of the application of such processes to the deposition of wear resistant coatings; insulating films for microcircuits (including devices such as thin film heads) or electronic devices such as capacitors; sophisticated architectural glass coatings; coatings on polyester film for architectural glass laminates or oxygen barriers for food packaging; heat reflecting coatings for high efficiency lamps or induction furnace heat shields; deposition of barrier and functional layers for flat panel displays, including the ITO glass used in LCD displays; and myriad other similar functional applications. Added to this are the many reactive PVD processes used to create decorative effects on a wide variety of plastic, natural and artificial fiber, and metal substrates.

A problem occurs in these cases, however, when the reaction product is an electrical insulator. Since, as described above, the insulating film coats every surface in the chamber (which it will eventually do) then it will surely eventually coat the anode.

As this happens the conduction path for the electrons is coated over, and the process cannot be sustained. This has been termed the "disappearing anode" problem. In the past the reactive process was run until this effect began to create serious problems, whereupon the system was opened to mechanically scrub off the offending insulating layer from the anode to create a new metallic surface. Thus continuous operation without this maintenance is not possible.

Another drawback related to the coating of the anode with an insulator is that this insulator will generally charge up as the electrons attempt to collect there. This charge can cause an electric field in the insulating film on the anode which may exceed the dielectric strength of the film material. When this occurs an arc may be formed and the energy in this arc may cause portions of the film to be ejected from the anode, creating particulates which can become included in the film growing on the substrate, causing defects which may be unacceptable in the final product.

Este, et al, in an article entitled "A Quasi-direct-current Sputtering Technique for the Deposition of Dielectrics at Enhanced Rates", published in *J. Vac. Sci. Technol. A*, vol. 6, No. 3 (May/June 1988), proposed an approach to the sputtering process which uses two targets alternately for deposition of dielectric or insulating films. The power supply, which in this case has an alternating potential output, is connected to the two targets so that they are driven alternatively positive and negative with respect to one another. This causes each to act as an anode for the other. If the reversal takes place often enough, only a very thin layer of insulator will be formed on the target acting as an anode, and this very thin layer can be sputtered away when it is that target's turn to be negative. This is possible because the insulator does not stop the sputtering process at once, but due to charging effects its presence will slow and eventually stop the process. If the layer is very thin it can be sputtered away before the process stops. The usual time for reversal is a few tens of microseconds, in order that there be too little time for a thick layer to form. See also the paper by Schiller et al entitled "Pulsed Magnetron Sputter Technology", published in the Proceedings of the 1993 International Conference on Metallurgical Coatings and Thin Films, Surf. Coat. Tech. Vol. 61, (1993) page 331, which covers a dual magnetron target approach similar to that of Este et al in that each of the targets acts within one cycle of the output of the power supply once as the cathode and once as the anode.

For the most part this has proved to be a successful approach to the problem of the "disappearing anode". It does have the disadvantage, however, of requiring two targets, which adds to the expense of the system and also complicates the maintenance. Also, it is difficult to retrofit this dual target process into existing sputtering systems because there often is no room for the second target.

A more serious drawback to the dual target approach is caused by the fact that appropriate design of the target assembly usually involves magnets to create a magnetic field above the target surface to enhance the plasma density. This magnetic field impedes the flow of electrons to the target. Thus an appropriate design for a cathode is generally not a good design for an anode, which calls for unimpeded collection of electrons from the plasma. In a sputtering system there is a potential difference between the plasma and the target, or cathode, which is called the "cathode fall". Similarly there is a potential difference between the plasma and the anode, generally much smaller, which is called the "anode fall". In a well designed system almost all of the voltage of the power supply appears as cathode fall and little appears as anode fall. In a typical case the cathode fall might be 600 volts and the anode fall less than 20 volts. With the dual target system, on the other hand, the anode fall is increased to much larger values, often as large as 50 to 100 volts. This creates two serious symptoms. First, the higher anode fall changes the plasma potential such that a higher energy substrate bombardment occurs. This can be beneficial, as some ion bombardment can help make the growing film more dense, but substrate bombardment also equates with substrate heating, and this can be a significant disadvantage if the substrate is composed of a heat sensitive material, such as plastic. Secondly, since the power supply current passes through the anode, the product of the anode fall and the current represents power loss in the anode. This in itself may be a problem, but even if the anode can withstand the heating effect, the power loss in the anode must necessarily subtract from the power of the power supply (that is the actual device or even any part of the circuitry involved in or which acts to facilitate some supply of power to the element involved) and thus reduce the power available to the cathode for sputtering purposes. Thus the deposition rate equivalent to each watt delivered by the power supply is reduced by the proportion of the anode fall to the cathode fall. In the example case above for dual cathode sputtering, the anode would receive ⅙ of the power (the current times 100 volts out of the 600 volts available from the power supply) and the cathode the balance of ⅚. This represents a loss of 16.7% of the potential sputtering power, while an anode fall of 10 volts would "steal" but 1.7% of the potential power to heat the anode. Of course, other losses may also exist, but a substantial anode fall can materially lower the deposition rate.

Consequently, a need exists for a different approach to overcome the above-described drawbacks of the prior art reactive sputtering processes. The present invention permits single target operation with a separate anode assembly with a small anode fall and therefore low substrate bombardment and good utilization of the sputtering power, without suffering from the problem of the "disappearing anode".

SUMMARY OF THE INVENTION

It is an object of the present invention, therefore, to provide an anode function for reactive sputtering systems with characteristics which create a relatively small anode fall relative to that observed in dual cathode sputtering systems.

It is a further object of this invention to reduce substrate heating in sputtering systems below that normally observed in dual cathode sputtering systems.

It is yet another object of the present invention to increase the sputtering rate of the target in a sputtering system for each watt delivered by the cathode power supply above that normally observed in dual cathode sputtering systems.

It is another object of the present invention to provide continuous operation by preventing stoppage of the reactive sputtering process due to buildup of an insulating film on the anode(s) of the system.

It is yet a further object of this invention to improve uniformity of deposition by avoiding the nonuniform electric fields caused by the buildup of insulating films on the anode(s) of the system.

It is yet a further goal of the invention to prevent arcing that may occur due to the buildup of insulating films on the anode(s) of the system, and thereby prevent the particulate matter dispersed in the chamber caused by the mechanical forces created by such arcing.

Accordingly, the present invention is directed to a system for sputter deposition of an insulating material on a substrate in a continuous mode of operation. The present invention discloses a novel design for an anode assembly to permit this, which assembly comprises a plurality of anodes, at least one of which at any given time might be biased positively (that is, the opposite polarity of the target) so as to provide a clean positive anode to the system, or more generally in an "electron-collecting state", and at least for some period of time might be biased negatively with respect to the plasma (that is, in the same polarity as the target), or more generally in an "ion-collecting state" so that any insulating material which may have been deposited thereupon may be sputtered away. This removal of any insulating material which may have formed on the anode structure permits its continuing effective use in collecting electrons from the plasma when it is biased positively, and therefore its continuing effective use as an anode for the system. This permits continuous operation of the system. A cathode power supply (as mentioned earlier, that is, that is the actual device or even any part of the circuitry involved in or which acts to facilitate some supply of power to the cathode) can be used to create a negative (ion collecting) potential on the cathode; this supply may be separate from the anode power supply, and may cause the state of the anodes to be alternated between the ion- and electron-collecting states.

The present invention is also directed to a method for sputter deposition of a target to create an insulating material on a substrate in a continuous operating mode. The method comprises the acts of providing a coating chamber, generating a plasma, providing a target cathode to be sputtered and at least two anodes, maintaining the cathode at a negative potential, but either switching or alternating the anodes between an ion-collecting (sputtering) state and an electron-collecting state. The existence of the ion-collecting state in this method permits sputtering of any insulating deposition on the anodes and thus permits a continuous mode of operation.

To strictly avoid contamination of the growing film on the substrate, the anode may preferably be made of the same material as the target, since some of its material may be deposited on the substrate as well. On the other hand, as already pointed out, very little of the anode is actually sputtered, and if a shield is arranged to intercept the majority of the sputtered material from the anode so that it does not arrive at either the target or the substrate, contamination can be kept to a minimum, and other materials may be used.

Such an approach is easier to retrofit into existing systems because the anode is physically much smaller than an additional target, and generally there exists sufficient room in a system to place the requisite pair of anodes.

In one embodiment, the present invention uses two anodes, together with a single target, to permit continuous operation. A small auxiliary ac power supply (called the "anode supply"), connected between the two anodes, produces an ac voltage of the order of several hundred volts peak. When one anode is positive, and is therefore acting as an anode, the other is made negative with respect to the plasma. This negative voltage attracts ions from the plasma (the "ion-collecting" state), which ions sputter away some of the anode surface. The other anode, meanwhile, is driven positive during this period, and this element therefore attracts and collects the electrons from the plasma (the "electron-collecting" state). On alternate half cycles of the anode supply, each anode alternately acts either as an electron collector, or as an ion-collector; in the latter state the anode is sputtered. The sputtering process keeps the anode free of insulating film. Since very little sputtering power is required to remove the thin film formed on each half cycle, very little of the anode material is actually sputtered away, and the anode can be made to last a long time.

In another embodiment, a plurality of anodes are placed in the chamber and each is driven negative to be sputtered during some portion of an alternation cycle. At any time at least one of the anodes is maintained at a positive potential to attract and collect electrons from the plasma. Alternatively, all of the anodes may be driven negative at once during the cycle preferably so that the period during which all of the anodes are negative is not long enough to extinguish the plasma, by which we mean that the density of the ions and electrons in the plasma has been reduced to levels below 10% of the steady state value.

It should be noted that, while the conception of the present invention was inspired by the need for a clean anode in reactive sputtering of insulating materials, it is not uncommon that anodes in metallic deposition can become coated with poorly conducting films back scattered onto them by the background gas, and therefore the present invention has application beyond reactive sputtering of insulators.

It is possible as well to use a single anode which is pulsed to a negative voltage on a regular basis. In this case there may be, for the period of the negative pulse, no specific anode in the system. The electrical circuit may then be arranged so that for this period the chamber walls become an anode or the current providing element, although in some cases it may be possible for the plasma to provide a small quantity of ions without an anode in the system, and in these cases no connection to the chamber wall is necessary. A version of this general approach may be taken with multiple elements by eliminating one of the conditions outlined previously; that is, all of the elements could be taken negative simultaneously for some period. Regardless of the number of elements, the time for which any element is kept negative should likely be long enough to attract ions from the plasma to the element and to sputter away the material deposited there.

In any of these embodiments, it is necessary for the cathode to be held negative with respect to the plasma so that it may be sputtered and a film be deposited. This is accomplished with a cathode power supply, which may be a simple dc supply or may be a high frequency supply. In the latter case a so-called "self bias" potential appears on the target surface due to the asymmetric nature of the plasma over a range of frequencies defined by a lower limit whereat the ions can fully reach the cathode in a single half cycle, and an upper limit whereat the electrons cannot reach the cathode in a single half cycle of the alternating waveform. Between these two limits, the electrons can traverse the gap between the plasma and the cathode surface, while the ions cannot, and the asymmetry thus created cause a self-bias to appear on the cathode in a manner well known to those skilled in the art of plasma processing.

DETAILED DESCRIPTION OF THE PREFERRED EMBODIMENTS

As can be easily understood, the basic concepts of the present invention may be embodied in a variety of ways. It involves both processes or methods as well as devices to accomplish such. In addition, while some specific circuitry is disclosed, it should be understood that these not only accomplish certain methods but also can be varied in a number of ways. Importantly, as to all of the foregoing, all of these facets should be understood to be encompassed by this disclosure.

Figure 1:
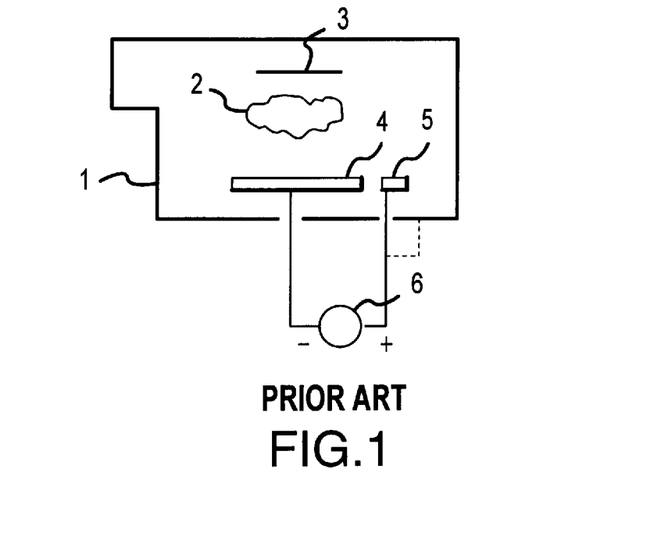
FIG. 1 shows a conventional single target sputtering system using dc power.

FIG. 1 shows a conventional single target system. In this case there may exist a discrete anode 5 or an alternative connection may be made whereby the positive lead of sputtering power supply 6 is connected to the chamber 1 rather than to anode 5. In this case anode 5 may be dispensed with. The alternative connection is shown in dotted lines in FIG. 1. Ions are attracted to target 4 from plasma 2 and upon striking target 4 cause sputtered atoms to be ejected from target 4 in accordance with well-known principles. These sputtered atoms traverse the space between the target and the substrate 3 and deposit there, creating a thin film of the target material thereupon.

Figure 2:
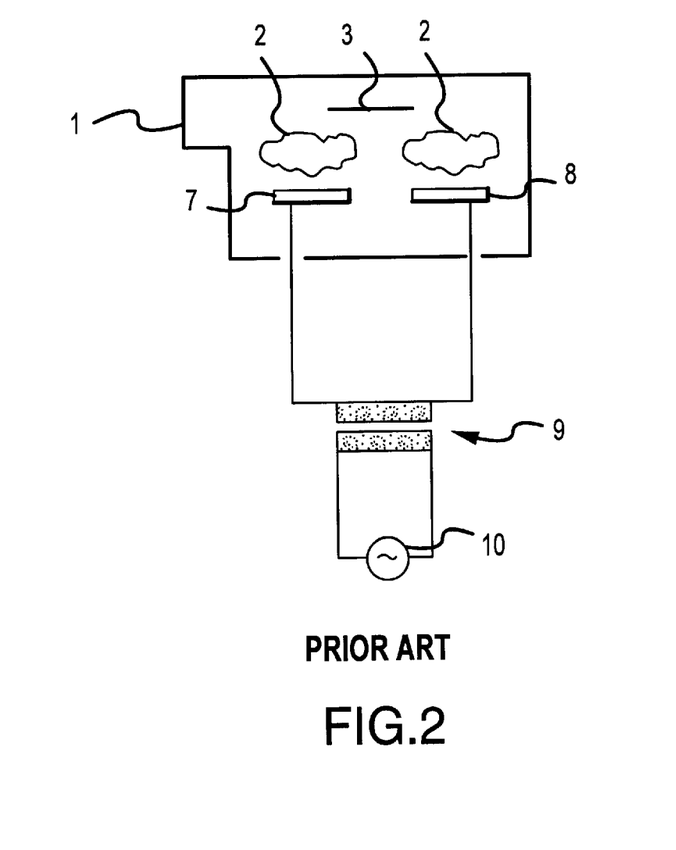
FIG. 2 shows a conventional dual target sputtering system using ac power.

Should the target be metallic and the background (sputtering) gas be an inert gas such as Argon, depositing metal films on substrate 3, there are little problems with a system configured such as in FIG. 1. If, however, a reactive gas is introduced into chamber 1 in order to create a chemical compound on the target, and if the reaction product is an electrical insulator, a problem surfaces. Since the insulating film will coat every surface in the chamber 1, it will eventually coat the anode (or in the case of the alternative connection, the chamber walls). As this happens the conduction path for the electrons streaming from the plasma 2 is coated over, and the process cannot be sustained. This is what has been termed the "disappearing anode" problem. While it is possible to open chamber 1 and mechanically scrub off the offending insulating layer from the anode or the chamber walls to create a new metallic surface, this is costly and time consuming and it would be desirable to avoid having to do so. This desire is believed to have inspired the invention of the system shown in FIG. 2. In FIG. 2 two targets 7 and 8 are disposed in the space normally occupied by the single target 4 in FIG. 1 and no separate anode is provided. A source of alternating power 10 is applied between the two targets 7 and 8 through isolating transformer 9. In this way each target 7 can act as an anode for target 8 when the voltage between the targets is such that target 7 is positive with respect to target 8. Similarly, target 8 can act as an anode for target 7 when the voltage between the targets is such that target 8 is positive with respect to target 7. Because the power supply 10 is an alternating source of power, this situation is reversed every half cycle of the current. If the reversal takes place often enough, only a very thin layer of insulator will be formed on target 7 when it is acting as an anode, and this very thin layer can be sputtered away when it is the turn of target 7 to be negative. The same may be said for target 8. Normally in systems such as shown in FIG. 2 the frequency of the power supply 10 is about 40 kHz, corresponding to a reversal every 12.5 μs.

As mentioned previously, this has proved to be a successful approach but has the disadvantage of requiring two targets 7 and 8, adding to the expense of the system and complicating maintenance. In addition, appropriate design for a target assembly such as target 7 or 8 may involve creation of a magnetic field above the target surface, and this field can impede the flow of electrons to the target. This may increase the anode fall (the voltage between the positive target and plasma 2) to values as large as 100 volts, in turn creating higher energy substrate bombardment and substrate heating. Also, the specific deposition rate (rate per watt) can be reduced by the proportion the anode fall is to the cathode fall (the voltage between the negative target and plasma 2).

Figure 3:
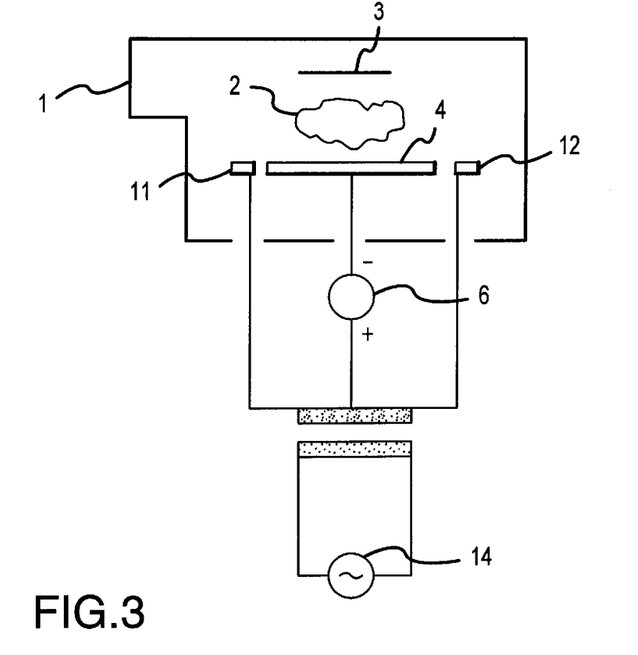
FIG. 3 shows one embodiment of the present invention with two anodes driven by a sinusoidal voltage source with the voltage on the two anodes 180° out of phase from one another.

One of the preferred embodiments of the present invention is shown in FIG. 3. In chamber 1 are disposed substrate 3, target 4, and at least two anodes 11 and 12. Anode drive supply 14 provides an alternating voltage isolated by anode transformer 13 to the two anodes such that when anode 11 is driven positive, anode 12 is driven negative and vice versa. The secondary of transformer 13 has a "tap", by which we mean that a connection is made to the secondary winding at a point removed from the ends. The tap may or may not be in the electrical center of the transformer so as to effect an equal division of the voltage. Target 4 is held negative with respect to the tap of the secondary of transformer 13 by cathode power supply 6, which supplies the sputtering power.

When the voltage cycle of the anode supply 14 is such that anode 11 is positive with respect to anode 12, anode 11 will collect electrons from the plasma (i.e., it can be said to be in an "electron-collecting" state). This will cause electron current in the left half of the secondary of transformer 13, flowing from anode 11 to the positive lead of dc supply 6. These electrons combine with ions arriving at target 4 from plasma 2 to complete the circuit. Meanwhile, anode 12 is driven negative with respect to the plasma by the action of transformer 13 and anode supply 14, and this negative potential attracts additional ions from the plasma (i.e., the anode is in an "ion-collecting" state). These ions cause sputtering of the surface of anode 12. This sputtering of anode 12 removes any buildup of insulating materials which might have formed there on the previous half cycle of the ac power supply 14 when anode 12 was positive and therefore near to the plasma potential.

Similarly, when the voltage cycle of the anode supply 14 is such that anode 12 is positive with respect to anode 11, anode 12 will collect electrons from the plasma. This will cause electron current in the right half of the secondary of transformer 13, flowing from anode 12 to the positive lead of dc supply 6. These electrons combine with ions arriving at target 4 from plasma 2 to complete the circuit. Meanwhile, anode 11 is driven negative with respect to the plasma by the action of transformer 13 and anode supply 14, and this negative potential attracts ions from the plasma which causes sputtering of the surface of anode 11. This sputtering of anode 11 removes any buildup of insulating materials which might have formed there on the previous half cycle of the ac power supply 14 when anode 11 was positive and therefore near to the plasma potential.

Thus each of the anode elements 11 and 12 act alternatively as true anodes (electron collectors) and as sputtered cathodes (ion collectors) depending upon the instantaneous polarity of the ac power supply 14.

Figure 4:
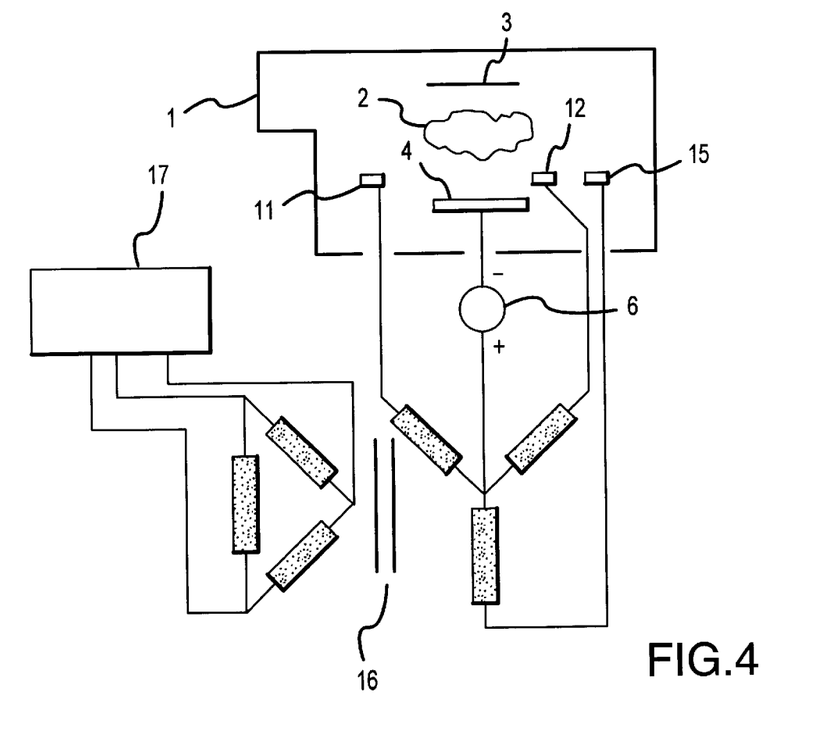
FIG. 4 shows another embodiment of the present invention with three anodes driven by a three-phase sinusoidal source with the voltage on the anodes 120° out of phase, each from the another.

Another embodiment of the present invention is shown in FIG. 4. In this figure an additional anode 15 has been placed near target 4 as compared to FIG. 3. The three anodes 11, 12, and 15 are driven by a three phase power supply 17 through a three phase transformer 16, here shown in a delta-wye connection. Of course, transformer 16 may also be configured in a wye-wye connection as is well known in the art. It is a feature of the wye connection that one lead of each of the three secondary windings is connected to a common point, usually called the "neutral" point. The cathode power supply 6 is connected with its positive lead to this common point and its negative lead to the cathode itself.

Figure 5:
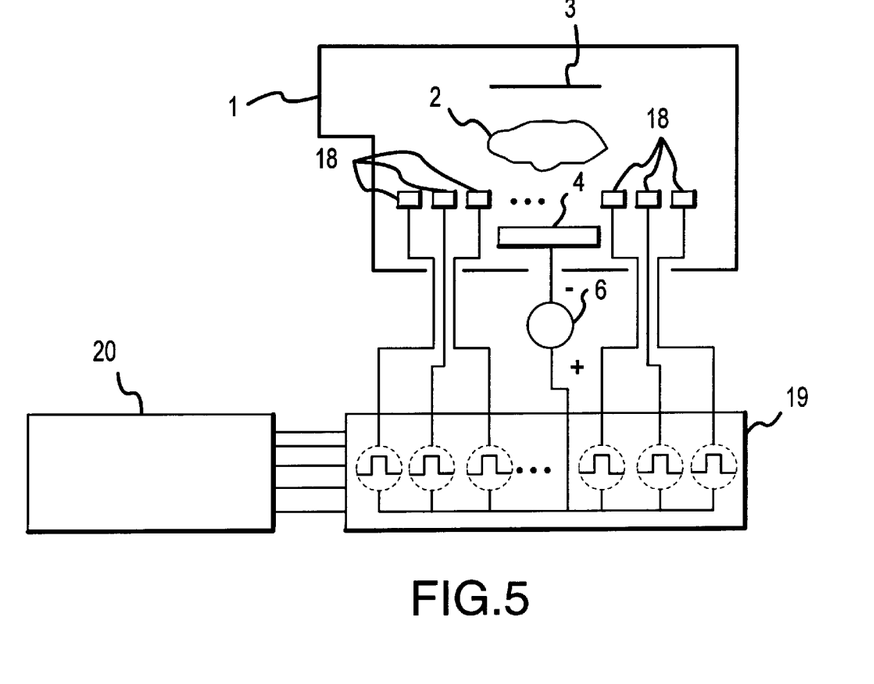
FIG. 5 shows a multi phase multiple anode configuration wherein a plurality of anodes are driven by a pulsed power supply with a pulse sequencer controlling the pulse voltages on each anode.

FIG. 5 shows yet another embodiment of the present invention. In this case a multiplicity of anodes 18 are placed in proximity to the target 4 and are driven by pulsed anode power supply 19. There may always be at least one anode at a positive potential in order that it may be near to the plasma potential and therefore be able to collect electrons, or at least that any period during which all anodes are negative with respect to the plasma is kept short enough that the plasma is not extinguished. (As intended here, and as one of ordinary skill in the art would readily understand, at least one anode would still "always" be in an ion-collecting state—even if there were brief interruptions—so long as the plasma were not extinguished.) This might ensure that the plasma potential will remain steady with respect to the chamber and that the sputtering process continues. The pulses on the anodes may be placed there in some sequence by pulse sequencer unit 20. The pulses might be so arranged that over one cycle of the sequence created by pulse sequencer unit 20, each anode might have assumed a negative potential relative to the plasma, in order that it attract ions and therefore be sputtered. This action should cause removal of a thin film of material from each anode on each cycle of pulse sequencer unit 20, which might ensure that its metallic surface remains conducting so that it may be an efficient attractor for electrons (i.e., act efficiently as an anode) when it is, in its turn, driven positive by pulsed power supply 19. Of course, the time any anode spends in a negative and positive condition need not be the same, and the time spent in either condition may be different for each anode, and these timings may be altered to optimize the process, taking into consideration the relative mobility of the ions and electrons, among other factors. As those skilled in the art would readily understand, such pulsing might also offer an advantage of more evenly powering the plasma, for instance as compared to a sinusoidally alternating type of system.

Figure 6:
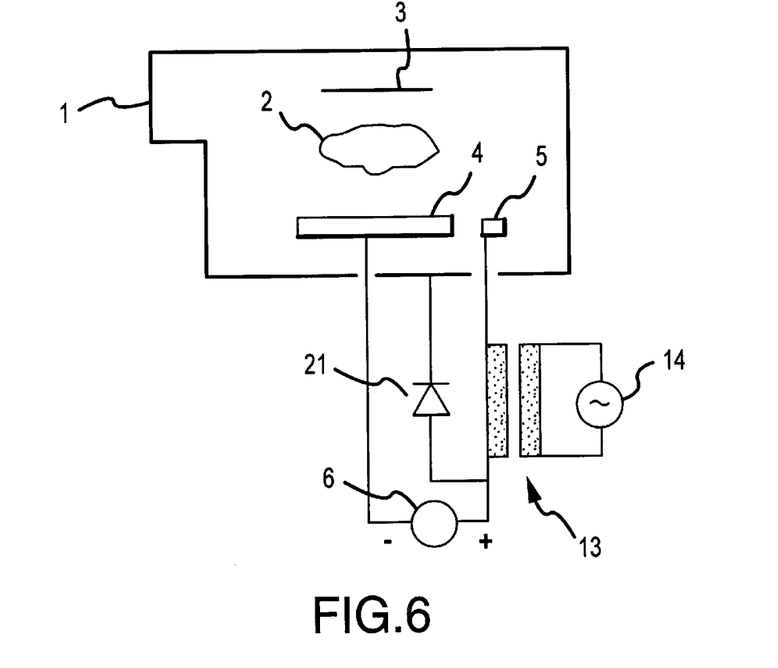
FIG. 6 shows an embodiment wherein a single anode is disposed in a chamber with an auxiliary electrical element which may be a diode or a capacitor.

FIG. 6 shows a single anode embodiment of the present invention. This differs from FIG. 1 in the addition of a series electrical element 21 connecting the positive lead of the cathode supply 6 to the chamber 1. This element 21 is shown as a diode, but it may also be a capacitor. Anode power supply 14 is connected in series with the anode 5 via isolation transformer 13. When the polarity of the anode power supply 14 is such that the anode is driven positive, the positive lead of the cathode supply 6 is driven negative and the cathode current flows through the secondary winding of transformer 13 to anode 14. When the polarity of the anode power supply 14 is such that the anode is driven negative, the positive lead of the cathode supply 6 is driven positive and the diode conducts, making the chamber a temporary anode.

If the electrical element 21 shown as a diode is replaced by a capacitor, then the capacitor will charge to an average value which will be dependent upon the timing of the anode supply 14. The capacitor 21 will be charged by the sputtering current of both the sputtering of anode 5 and target 4 during the period when the anode 5 is driven negative, and will be discharged when the anode 5 is driven positive.

Figure 7:
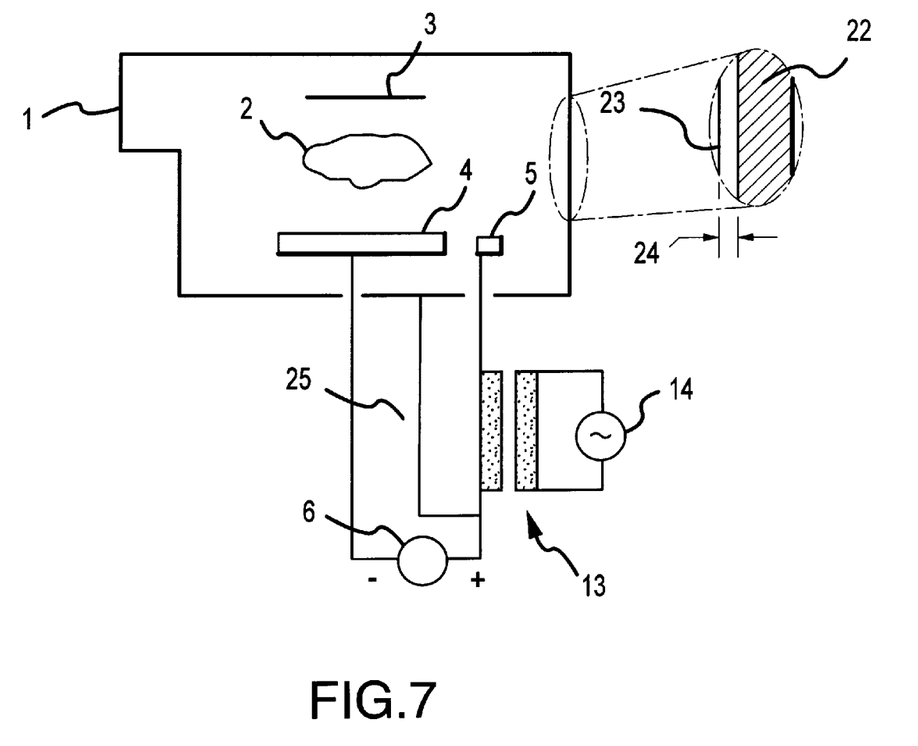
FIG. 7 shows a single anode configuration of the present invention wherein the electrical element of FIG. 6 is replaced with a short circuit. Also shown is a detail of the deposited film on the walls and how it forms an equivalent capacitor.
Figure 8:
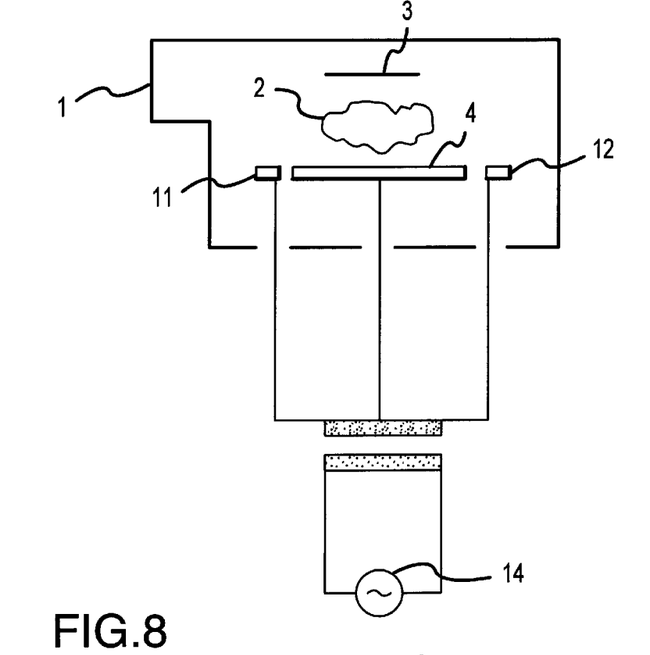
FIGS. 8, 9, and 10 show embodiments similar to those in FIGS. 3, 4, and 6 without a D.C. supply.
Figure 9:
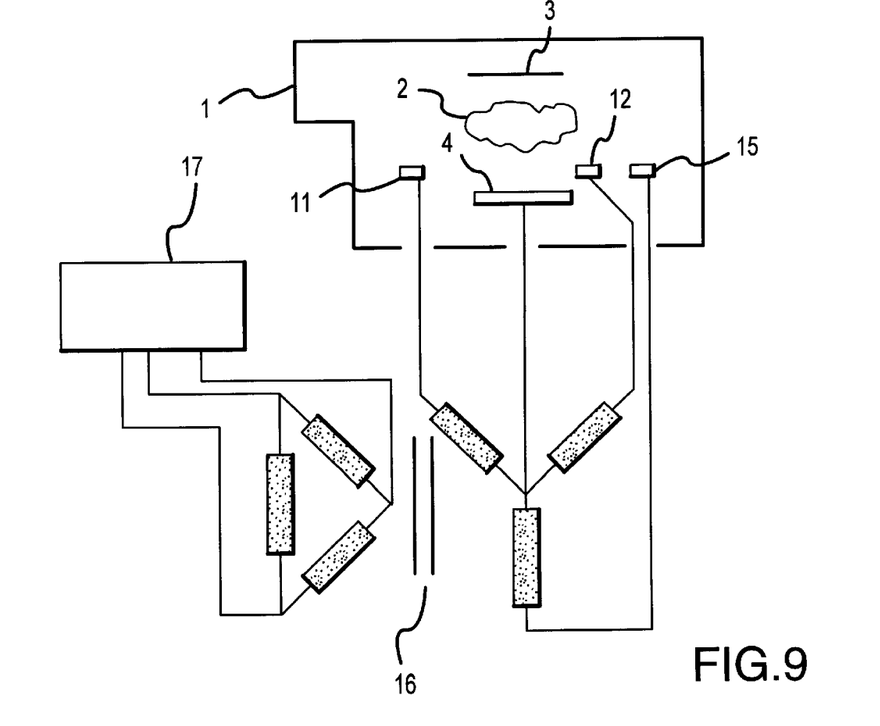
Figure 10:
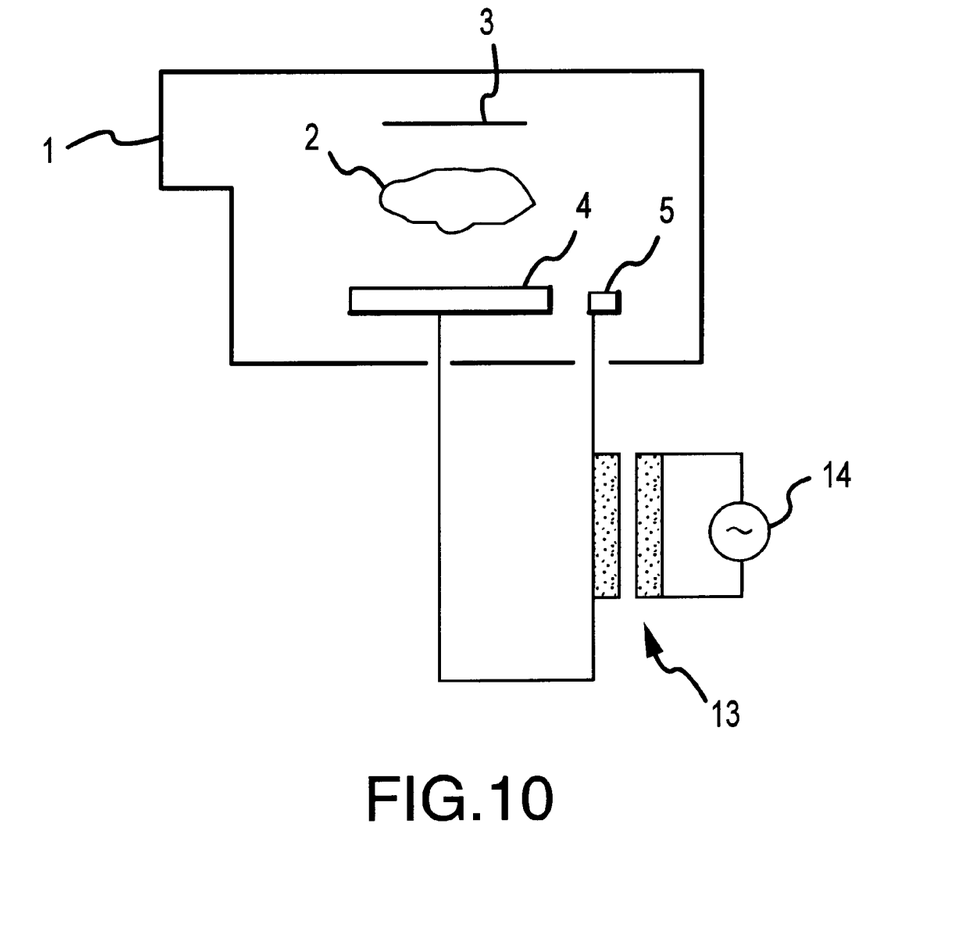

It may be noted that once the chamber has been coated by an insulating layer, that thin film forms a capacitor with the plasma, and will act in the same way as the capacitor 21. This may be seen in FIG. 7. Here a single anode system is shown with an expanded view of the chamber wall, showing the chamber wall 22 coated with the insulating film 23 forming an equivalent capacitor 24. This equivalent capacitor would have effectively been in series with electrical element 21 were it placed in the circuit, making this electrical element redundant. Therefore in FIG. 7 the electrical element has been replaced with a direct connection 25. The equivalent capacitor then takes the place of the capacitive electrical element 21. In this case the chamber acts as an anode until it becomes coated. At that point the anode element takes over, as it has been kept clean by sputtering action due to the periodic negative potential placed upon it relative to the plasma by the action of anode drive supply 14. Care must be taken in either case to design the transformer 13 so that it may handle dc current in its secondary winding without saturation, as the current in the secondary will not, in the general case, average to zero. Care must be taken in either case to design the transformer 13 so that it may handle dc current in its secondary winding without saturation, as the current in the secondary will not, in the general case, average to zero.

In all embodiments, should it be desired that a chemical compound be formed at the substrate, a reactive gas flow may be introduced into the chamber so that the sputtered material from the target may react with the gas to form a compound on the substrate. Common examples may be sputtering silicon in the presence of oxygen to obtain $SiO_2$; sputtering aluminum in the presence of oxygen to obtain $Al_2O_3$; sputtering aluminum in the presence of nitrogen to obtain AlN, etc.

As mentioned earlier, this invention can be embodied in a variety of ways. In addition, each of the various elements of the invention and claims may also be achieved in a variety of manners. This disclosure should be understood to encompass each such variation, be it a variation of an embodiment of any apparatus embodiment, a method or process embodiment, or even merely a variation of any element of these. Particularly, it should be understood that as the disclosure relates to elements of the invention, the words for each element may be expressed by equivalent apparatus terms or method terms—even if only the function or result is the same. Such equivalent, broader, or even more generic terms should be considered to be encompassed in the description of each element or action. Such terms can be substituted where desired to make explicit the implicitly broad coverage to which this invention is entitled. As but one example, it should be understood that all action may be expressed as a means for taking that action or as an element which causes that action. Similarly, each physical element disclosed should be understood to encompass a disclosure of the action which that physical element facilitates. Regarding this last aspect, the disclosure of a "switch" should be understood to encompass disclosure of the act of "switching" —whether explicitly discussed or not—and, conversely, were there only disclosure of the act of "switching", such a disclosure should be understood to encompass disclosure of a "switch." Such changes and alternative terms are to be understood to be explicitly included in the description.

The foregoing discussion and the claims which follow describe the preferred embodiments of the invention. Particularly with respect to the claims, it should be understood that changes may be made without departing from their essence. In this regard it is intended that such changes would still fall within the scope of the present invention. It is simply not practical to describe and claim all possible revisions which may be accomplished to the present invention. To the extent such revisions utilize the essence of the invention each would naturally fall within the breadth of protection accomplished by this patent. This is particularly true for the present invention since its basic concepts and understandings are fundamental in nature and can be applied in a variety of ways to a variety of fields.

Furthermore, any references mentioned in the application for this patent as well as all references listed in any information disclosure originally filed with the application are hereby incorporated by reference in their entirety to the extent such may be deemed essential to support the enablement of the invention(s). However, to the extent statements might be considered inconsistent with the patenting of this/these invention(s) such statements are expressly not to be considered as made by the applicant(s).

We claim:

1. A system for sputter deposition of a cathode material to form a material upon a substrate in a continuous operating mode, said system comprising:
    (a) a coating chamber in which a plasma is created comprising ions and electrons;
    (b) at least two anodes disposed in said chamber;
    (c) a cathode disposed in said chamber adjacent to said plasma, said cathode containing atoms that can be sputtered therefrom in response to bombardment by said ions from said plasma to deposit a film on a surface of said substrate; and
    (d) an ac supply of power at a frequency such that said cathode assumes a self bias potential which is negative relative to the plasma wherein said ac supply of power is connected to said anodes and said cathode so as to drive said anodes alternately to an ion-collecting state wherein said anodes attract said ions when maintained at a negative potential relative to said plasma, and an electron-collecting state wherein said anodes attract said electrons when maintained at a positive potential relative to said plasma, said ion-collecting state and said electron-collecting state occurring while said cathode is maintained at a negative potential relative to said plasma by said supply of power.

2. The system of claim 1 wherein said ac supply of power at a frequency such that said cathode assumes a self bias potential which is negative relative to the plasma comprises a single ac power supply.

3. The system of claim 1 wherein said ac power supply has a cycle, and wherein during said cycle at least one of said anodes is always in said electron-collecting state.

4. The system of claim 1 wherein said ac power supply has a cycle, and wherein during said cycle the period during which every one of said anodes is in said ioncollecting state is less than the time required to extinguish said plasma.

5. The system of claims 3 or 4 wherein said ac power supply comprises a pulsed power supply and wherein said pulsed power supply causes each anode to be switched between said ion-collecting state and said electron-collecting state.

6. The system of claim 1 wherein said coating chamber contains a reactive gas.

7. The system of claim 6 wherein said atoms sputtered from said cathode in response to bombardment by said ions react with said reactive gas to form and deposit said film.

8. A system for sputter deposition of a cathode material to form a material upon a substrate in a continuous operating mode, said system comprising:

(a) a coating chamber in which a plasma is created comprising ions and electrons;

(b) at least one anode disposed in said chamber;

(c) a cathode disposed in said chamber adjacent to said plasma, said cathode containing atoms that can be sputtered therefrom in response to bombardment by said ions from said plasma to deposit a film on a surface of said substrate; and (d) an ac supply of power at a frequency such that said cathode assumes a self bias potential which is negative relative to the plasma wherein said ac supply of power is connected to said anode and said cathode so as to cause said anode to be driven alternately to an ion-collecting state wherein said anode attracts said ions when said anode is maintained at a negative potential relative to said plasma, and an electron-collecting state wherein said anode attracts said electrons when said anode is maintained at a positive potential relative to said plasma, said ion-collecting state and said electron-collecting state occurring while said cathode is maintained at a negative potential relative to said plasma by said supply of power.

9. The system of claim 8 wherein said ac supply of power at a frequency such that said cathode assumes a self bias potential which is negative relative to the plasma comprises a single ac power supply.

10. The system of claim 8 wherein said ac supply of power has a cycle, and wherein during said cycle the period during which said anode is in said ion-collecting state is less than the time required to extinguish said plasma.

11. The system of claim 8 wherein said ac supply of power is connected to said chamber through a series electrical element which provides for current flow during the period said anode is caused to be in said ion-collecting state by said anode power supply.

12. The system of claim 11 wherein said series electrical element comprises a diode.

13. The system of claim 11 wherein said series electrical element comprises a capacitor.

14. The system of claim 11 wherein said series electrical element is replaced by a short circuit.

15. The system of claim 8 wherein said coating chamber contains a reactive gas.

16. The system of claim 15 wherein said atoms sputtered from said cathode in response to bombardment by said ions react with said reactive gas to form and deposit said film.

17. A method for sputter deposition of an insulating material on a substrate in a continuous operating mode, said method comprising:

(a) providing a coating chamber in which a plasma is created of ions and electrons;

(b) providing at least two anodes in said chamber;

(c) providing a cathode in said chamber adjacent to said plasma, said cathode containing atoms that may be sputtered therefrom in response to bombardment by ions from said plasma to form and deposit a material on said substrate;

(d) maintaining said cathode at a negative potential relative to said plasma by an ac supply of power; and (e) alternating said anodes between an ion-collecting state wherein said anodes attract said ions when maintained at a negative potential relative to said plasma, and an electron-collecting state wherein said anodes attract said electrons when maintained at a positive potential relative to said plasma by said ac supply of power, said ion-collecting state and said electron-collecting state occurring while said cathode is maintained at a negative potential relative to said plasma, and wherein said step of alternating said anodes occurs at a frequency such that said cathode assumes a self bias potential which is negative relative to the plasma.

18. The method of claim 17 wherein said act of alternating said anodes, and said act of maintaining said cathode at a negative potential relative to said plasma comprises the step of utilizing a single ac power supply.

19. The method of claim 17 wherein said act of alternating said anodes comprises alternating said anodes in a cycle, and wherein during said cycle at least one of said anodes is always in said electron-collecting state.

20. The method of claim 17 wherein said act of alternating said anodes comprises alternating said anodes in a cycle, and wherein during said cycle the period during which every one of said anodes is in an ion-collecting state is less than the time required to extinguish said plasma.

21. The method of claims 19 or 20 wherein said act of alternating said anodes in a cycle further comprises holding each of said anodes in an ion-collecting state for at least a portion of said cycle.

22. The method of claim 17 wherein said act of alternating said anodes comprises providing a voltage from an ac supply through a transformer having at least one primary winding connected to said ac supply and at least one secondary winding connected to said anodes.

23. The method of claim 17 farther comprising providing a reactive gas to said chamber.

24. The method of claim 23 further comprising choosing said reactive gas such that said atoms sputtered from said cathode in response to bombardment by said ions react with said reactive gas to form and deposit a material which is insulating.

25. A method for sputter deposition of a material on a substrate in a continuous operating mode, said method comprising:

(a) providing a coating chamber;

(b) generating a plasma of ions and electrons therein;

(c) providing at least one anode in said chamber;

(d) providing a cathode in said chamber adjacent to said plasma, said cathode containing atoms that are sputtered therefrom in response to bombardment by ions from said plasma to form and deposit a material on said substrate;

(e) maintaining said cathode at a negative potential relative to said plasma by an ac supply of power, and;

(f) alternating said anode so as to cause said anode to be driven alternately to an ion-collecting state wherein said anode attracts said ions when said anode is maintained at a negative potential relative to said plasma, and an electron-collecting state wherein said anode attracts said electrons when said anode is maintained at a positive potential relative to said plasma by said ac supply of power, said ion-collecting state and said electron-collecting state occurring while said cathode is maintained at a negative potential relative to said plasma, and wherein said step of alternating said anodes occurs at a frequency such that said cathode assumes a self bias potential which is negative relative to the plasma.

26. The method of claim 25 wherein said act of alternating said anode, and said act of maintaining said cathode at a negative potential relative to said plasma comprises the step of utilizing a single ac power supply.

27. The method of claim 25 wherein said act of alternating said anode comprises alternating said anode in a cycle, and wherein during said cycle the period during which said anode is in said ion-collecting state is less than the time required to extinguish said plasma.

28. The method of claim 26 or 27 wherein said act of maintaining said cathode at a negative potential relative to said plasma further comprises providing for plasma current flow during the period said anode is caused to be in said ion-collecting state.

29. The method of claim 28 wherein said act of providing comprises utilizing a diode.

30. The method of claim 28 wherein said act of providing comprises utilizing a capacitor.

31. The method of claim 28 wherein said act of providing comprises utilizing a short circuit.

32. The method of claim 25 further comprising providing a reactive gas to said chamber.

33. The method of claim 32 further comprising choosing said reactive gas such that said atoms sputtered from said cathode in response to bombardment by said ions react with said reactive gas to form and deposit a material which is insulating.

* * * * *